United States Patent
Suzuki et al.

(10) Patent No.: US 8,087,427 B2
(45) Date of Patent: Jan. 3, 2012

(54) VAPOR PHASE EPITAXY APPARATUS AND IRREGULAR GAS MIXTURE AVOIDANCE METHOD FOR USE THEREWITH

(75) Inventors: Kunihiko Suzuki, Shizuoka (JP); Hideki Ito, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 592 days.

(21) Appl. No.: 11/276,493

(22) Filed: Mar. 2, 2006

(65) Prior Publication Data
US 2006/0196411 A1    Sep. 7, 2006

(30) Foreign Application Priority Data

Mar. 4, 2005  (JP) ................. 2005-061122
Feb. 20, 2006 (JP) ................. 2006-041885

(51) Int. Cl.
 F16K 31/12  (2006.01)
 F16K 31/36  (2006.01)
 F16K 17/26  (2006.01)
 F16K 24/00  (2006.01)
 C23C 16/00  (2006.01)
(52) U.S. Cl. ...................... 137/486; 118/715
(58) Field of Classification Search ............. 137/486
See application file for complete search history.

(56) References Cited

U.S. PATENT DOCUMENTS

| | | | | |
|---|---|---|---|---|
| 5,441,076 A | * | 8/1995 | Moriya et al. | 137/486 |
| 5,948,958 A | * | 9/1999 | Bang et al. | 73/1.36 |
| 6,227,035 B1 | * | 5/2001 | Rice et al. | 73/37.9 |
| 6,324,892 B1 | * | 12/2001 | Nishina et al. | 73/23.2 |
| 6,515,290 B1 | * | 2/2003 | Rzeszut et al. | 250/492.21 |
| 2003/0036272 A1 | * | 2/2003 | Shamouilian et al. | 438/691 |
| 2004/0050326 A1 | * | 3/2004 | Thilderkvist et al. | 118/715 |

FOREIGN PATENT DOCUMENTS

| | | |
|---|---|---|
| JP | 9-17734 | 1/1997 |
| JP | 2000-282241 | 10/2000 |
| JP | 2001-135576 | 5/2001 |
| JP | 2004-281673 | 10/2004 |

* cited by examiner

*Primary Examiner* — Keath Chen
(74) *Attorney, Agent, or Firm* — Oblon, Spivak, McClelland, Maier & Neustadt, L.L.P.

(57) ABSTRACT

A vapor phase epitaxy apparatus having a processing chamber with a target workpiece such as a wafer being received therein is disclosed. This apparatus includes a first flow path which supplies the chamber with a gas needed for vapor phase epitaxial film formation on the wafer, and a valve unit for controlling the gas flow in the first flow path. The apparatus also includes a second flow path for supplying into the chamber a cleaner gas for cleaning of the interior of the chamber, and a third flow path for exhaust of residual gases within the chamber. The valve unit has a series combination of two-stage valves with a pressure switch being provided therebetween. An irregular gas mixture avoiding method for use with the apparatus is also disclosed.

5 Claims, 3 Drawing Sheets

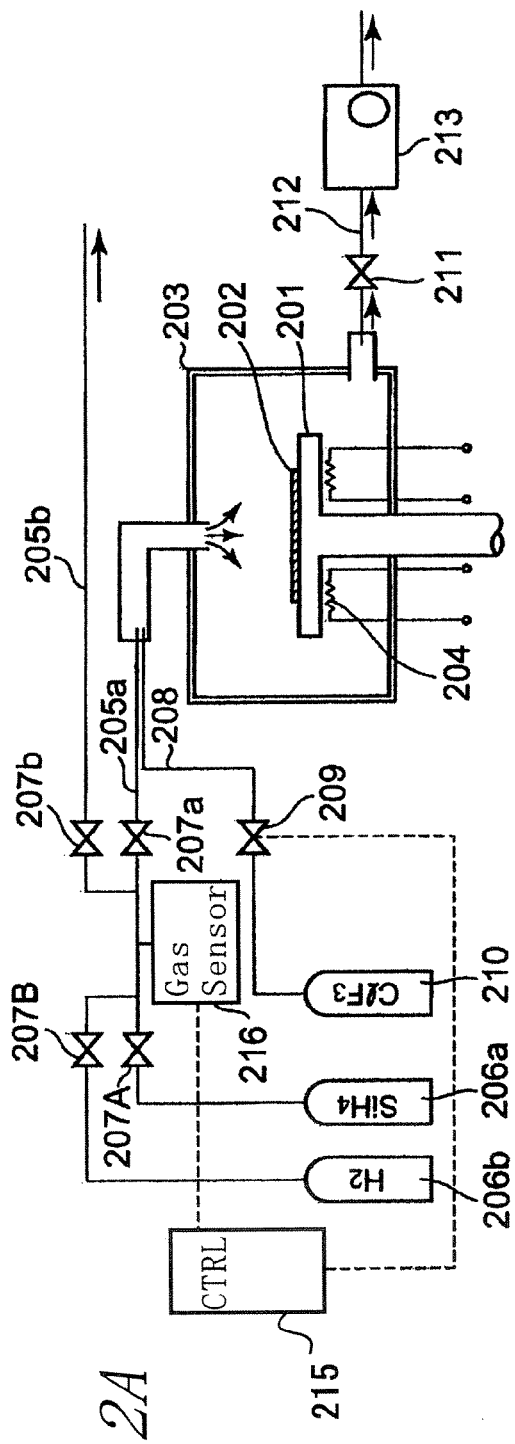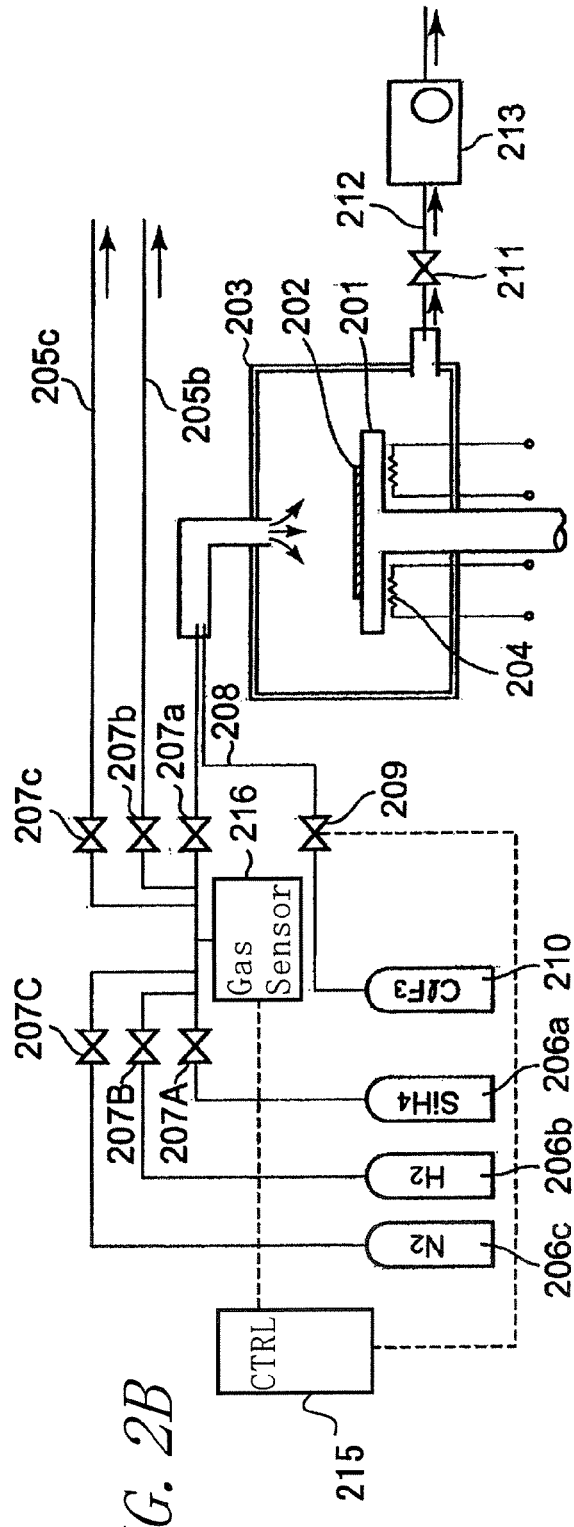

VAPOR PHASE EPITAXY APPARATUS AND IRREGULAR GAS MIXTURE AVOIDANCE METHOD FOR USE THEREWITH

CROSS-REFERENCE TO RELATED APPLICATION(S)

This application is based upon and claims the benefit of priority from Japanese patent application No. 2005-061122, filed Mar. 4, 2005 and Japanese patent application No. 2006-041885, filed Feb. 20, 2006, the entire contents of which are incorporated herein by reference.

BACKGROUND OF THE INVENTION

1. Field of the Invention

The present invention relates generally to a vapor phase growth apparatus arranged to avoid unwanted mixture of reactant and cleaning gases. This invention also relates to a gas mixture avoiding method for use in the vapor phase growth apparatus.

2. Related Art

Prior known on-wafer film fabrication systems typically include a vapor phase growth apparatus using chemical vapor deposition (CVD) techniques, such as vapor phase epitaxial (VPE) growth schemes. An example of such epitaxy apparatus is disclosed in Published Unexamined Japanese patent application No. 9-17734 ("JP-A-9-17734"). The apparatus as taught thereby is designed to form a silicon (Si) film by use of a mixture or "blend" of a gas of reactant species and a carrier gas, such as gaseous silane ($SiH_4$) and hydrogen ($H_2$).

Note here that a polycrystalline silicon or "poly-Si" film is fabricated on a substrate with inferior crystallinity whereas a single-crystalline silicon (Si) film is on single-crystal Si substrate.

An exemplary film fabrication apparatus is shown in FIG. 3. As shown herein, a single-crystal semiconductor wafer 302 is loaded and mounted on a support table structure 301 in a processing chamber 303. This wafer 302 is heated by a heater 304 up to a prespecified temperature high enough to achieve the intended film formation.

The chamber 303 has a gas flow path (first path) as coupled thereto, including a parallel combination of gas feed pipes 305a and 305b. These gas pipes 305a-305b are associated at their far ends with gas cylinders 306a and 306b which contain gases of monosilane ($SiH_4$) and hydrogen ($H_2$), respectively. The $SiH_4$ gas feed pipe 305a is provided with a valve 307a at a midstream location thereof, while the $H_2$ gas pipe 305b has a valve 307b. These valves 307a-307b are each driven to open and close for control of the gas flow rate in pipe 305a, 305b.

While the valves 307a-307b open, the $SiH_4$ and $H_2$ gases are supplied from the cylinders 306a-306b via the pipes 305a-305b to the interior space of the chamber 303, resulting in a Si film being formed by epitaxial growth on the single-crystal Si wafer 302. Usually this film formation will be repeated a number of times. For example, as suggested by JP-A-2000-282241, when letting the $SiH_4$ gas contain a dopant gas of boron (B), aluminum (Al) or gallium (Ga), it is possible to form a single-crystal semiconductor layer of p-type conductivity; use a dopant gas of phosphorus (P) or arsenic (As) for n-type. Additionally, as taught from JP-A-2004-281673, a silicon dioxide ($SiO_2$) film is formable by supplying $SiH_4$ and $O_2$ gases, and an $Si_3N_4$ film is fabricatable by supply of $SiN_4$ and $HN_3$ gases.

The chamber 303 is also equipped with a gas flow path 308 which is used to supply thereto a $ClF_3$ gas—more specifically, a $CF_4$ gas in the case of forming $SiO_2$ films, and $C_2F_6$ gas in the case of $Si_3N_4$ films. The flow path 308 has a gas flow control valve 309 at its midstream part.

After having formed the intended film (i.e., Si single-crystal film), cleaning is applied to the interior of the chamber 303. During the cleaning, let the valve 309 open whereby a cleaning gas of $ClF_3$ is supplied from a cylinder 310 to the chamber 303 along the gas flow path 308.

In the on-wafer film formation and intra-chamber cleaning processes, the interior of chamber 303 is evacuated by a vacuum pump 313 coupled thereto through a gas exhaust pipe 312 with a valve 311 being opened so that residual gases within chamber 303 are drained away to the outside.

In the vapor phase epitaxy apparatus shown in FIG. 3, a need is felt to prevent unwanted mixture of the $SiH_4$ reactant gas used for film formation and the $ClF_3$ cleaner gas, because such gas mixture poses a high level of danger.

To this end, an attempt is made during cleaning to completely close the valve 306a that is coupled to the gas pipe 305a for flowage of the $SiH_4$ reactant gas used for film formation. What must also be done is to "purge" the chamber interior by a chosen gas, e.g., nitrogen ($N_2$), after completion of the film formation. Thereafter, the exhaust valve 311 is opened to perform vacuuming by the vacuum pump 313 coupled to gas exhaust pipe 312, causing residual $SiH_4$ gas to be discharged from chamber 303 almost completely.

The prior art method has an advantage as to the capability to ascertain the completion of gas exhaust in the evacuation event. Unfortunately this advantage does not come without accompanying penalties, one of which is the lack of an ability to check whether the $SiH_4$ gas leaks or "intrudes" into the chamber during cleaning. In other words, the prior art has no means to detect the intrusion of $SiH_4$ gas into the chamber.

As apparent from the foregoing, prior art vapor phase growth apparatus remains deficient in safety and thus is required for further improvements in system architecture.

BRIEF SUMMARY OF THE INVENTION

This invention was made in view of the above-stated background and provides a new and improved vapor phase growth apparatus with enhanced safety and also a gas mixture avoidance method for use in this apparatus.

In accordance with one aspect of this invention, a vapor phase growth apparatus includes a first flow path which supplies a chamber with a gas as required for vapor phase epitaxial film formation on or above a wafer being received in the chamber, a valve unit for control of flow of the gas in the first flow path, a second flow path for supplying into the chamber a cleaner gas for cleaning of inside of the chamber, and a third flow path for exhaust of a residual gas or gases within the chamber. The valve unit has a series combination of two-stage valves with a pressure switch being provided therebetween.

In accordance with another aspect of the invention, a vapor phase growth apparatus includes a first flow path which supplies a chamber with a wafer settled therein a gas used to form by vapor phase epitaxy a film on the wafer in the chamber, and a valve unit for flow control of the gas in the first flow path. The apparatus also includes a second flow path used to supply into the chamber a cleaner gas for cleaning of the interior of the chamber, and a third flow path for exhaust of a residual gas(es) in the chamber. The valve unit has a serial combination of two-stage valves with a gas sensor interposed therebetween.

In accordance with a further aspect of the invention, a gas mixture avoiding method adaptable for use with the vapor phase growth apparatus is provided. When supplying a cleaning gas to the interior of the chamber, close the two-stage valves to thereby permit startup of cleaning. Upon occurrence of a pressure change of the pressure switch during the cleaning, prevent supplying of the cleaning gas, thereby to preclude mixture of the hydride gas and the cleaning gas.

In accordance with another further aspect of the invention, a gas mixture avoidance method for use with the vapor phase growth apparatus is provided. When supplying a cleaning gas into the chamber, close the two-stage valves to thereby permit startup of cleaning. During the cleaning, when the has sensor detects the presence of hydride gas, interrupt supply of the cleaning gas to thereby avoid mixture of the hydride gas and the cleaning gas.

BRIEF DESCRIPTION OF THE DRAWINGS

FIGS. 2A and 2B are diagrams each depicting a configuration of a vapor phase epitaxy apparatus also embodying the invention.

DETAILED DESCRIPTION OF THE INVENTION

Embodiments of this invention will be described in detail with reference to the accompanying drawings below.

Embodiment 1

Figure 1:
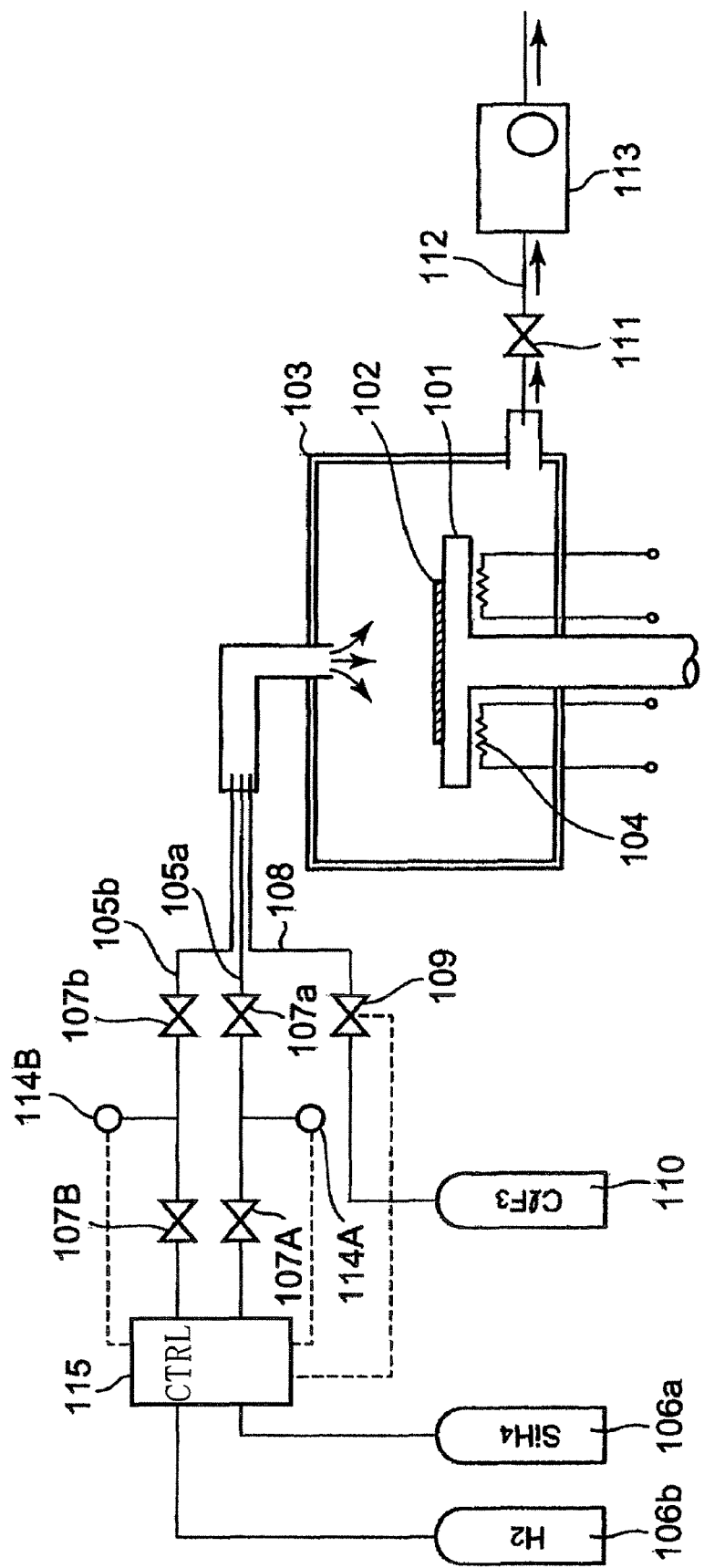
FIG. 1 is a diagram showing an overall configuration of a vapor phase epitaxy apparatus embodying this invention.
Figure 3:
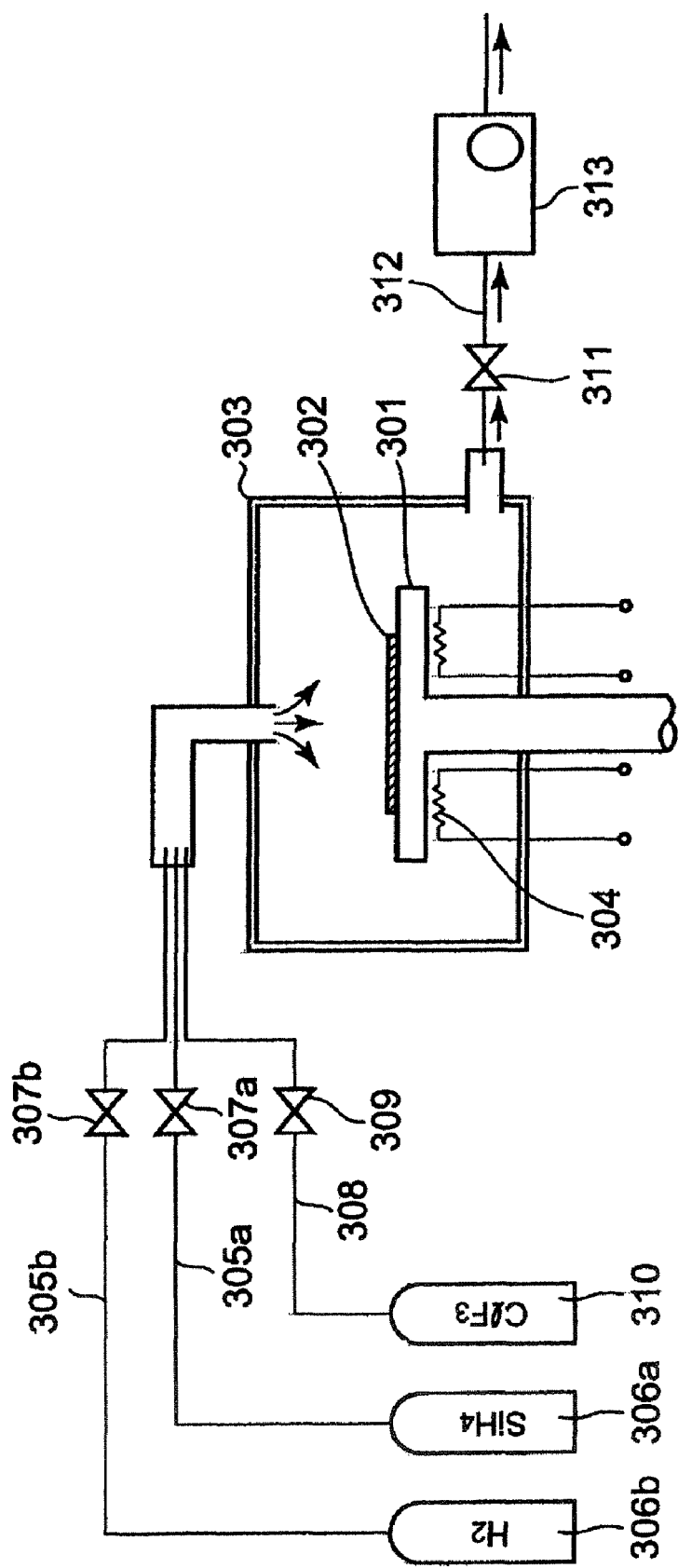
FIG. 3 illustrates an arrangement of one prior known vapor phase growth apparatus.

Referring to FIG. 1, a vapor phase epitaxy (VPE) apparatus embodying the invention is shown, which is generally similar in basic configuration to that of FIG. 3 except for its unique feature to be later described. As shown in FIG. 1, a table-like workpiece-support structure 101 is provided in a growth reactor housing 103, called the chamber, for mounting thereon a single-crystalline silicon (Si) wafer 102, which is loaded into the chamber 103 and mounted on table 101. This single-crystal Si wafer 102 is heated by a heater module 104 up to a temperature high enough to permit film fabrication on wafer 102.

The chamber 103 is associated with a parallel combination of gas flow passages 105a and 105b as coupled thereto. These passages make up a first flow path. The gas passage 105a may be a duct or pipe which permits flow of a reactant gas of $SiH_4$, while passage 105b is a pipe for conducting a carrier gas, e.g., gaseous hydrogen ($H_2$). These gas pipes 105a-105b have their far ends which are coupled to gas cylinders 106a and 106b, respectively. The $SiH_4$ gas pipe 105a has in its midstream locations a pair of valves 107A and 107a for gas flow adjustment. The $H_2$ gas pipe 105b has its own valves 107B-107b. In other words, a serial combination of spaced-apart valves 107A-107a is provided for control of the flow rate of $H_2$ gas; similarly, a series combination of valves 107B-107b is for $SiH_4$ gas flow control. An electrical pressure switch 114A is coupled to $SiH_4$ gas pipe 105a at a portion midway between the valves 107A-107a. A pressure switch 114B is joined to $H_2$ gas pipe 105b at its portion between the valves 107B-107b. These pressure switches 114A-114B have outputs connected to a control device 115. Also connected to this controller 115 is a valve 109, which is provided in a cleaning gas flow pipe 108 for controlling the flow rate of such cleaner gas—here, $ClF_3$ gas as an example.

Letting the $SiH_4$ gas contain therein boron (with the aid of a dopant gas of diborane ($B_2H_6$)) makes it possible to form a single-crystal Si layer of p-type conductivity. Alternatively, adding phosphorus (using a phosphine ($PH_3$) gas) to the $SiH_4$ gas enables formation of an n-type single-crystal Si layer. The dopant gas to be contained in $SiH_4$ gas should not exclusively be limited to the $B_2H_6$ and $PH_3$ gases and may be replaced with other gases which contain aluminum (Al) or arsenic (As) or other similar suitable dopant species, when the need arises.

When the valves 107A-a and 107B-b are driven to open, the reactant and carrier gases leaving the cylinders 106a-106b are guided to flow in pipes 105a-105b and supplied to the interior space of the chamber 103, so a single-crystal Si film is formed on the wafer 102 as mounted on table 101. This film formation will be repeated several times in most cases. In the illustrative embodiment, a mixture of $SiH_4$ and $PH_3$ gases and an $H_2$ gas are first supplied to chamber 103, thereby to form an n-type single-crystal Si layer on wafer 102. Then, a $B_2H_6$-added $SiH_4$ gas and the $H_2$ gas are fed to chamber 103 so that a p-type single-crystal Si layer is formed thereon.

The chamber 103 is also equipped with a gas pipe 108 coupled thereto for supplying a cleaning gas, such as $ClF_3$. This pipe makes up a second flow path of the apparatus shown in FIG. 1. The cleaner gas feed pipe 108 has at its midstream position a valve 109 for flow adjustment—i.e., flowing and blocking—of the $ClF_3$ gas. This valve 109 is connected to and turn-on/off controlled by the control device 115. The $ClF_3$ gas feed pile 108 is coupled at its remaining end to a gas cylinder 110, i.e., cleaner gas supply.

After having formed the intended films (e.g., p- and n-type single-crystal Si layers), the inside space of the chamber 103 is subjected to cleaning. In this case, the $ClF_3$ cleaner gas is fed to chamber 103 via gas pipe 108 while letting its valve 109 open.

In the on-wafer film formation and chamber interior cleaning processes, any residual gases within the chamber 103 are exhausted or "vacuumed" by a vacuum pump 113 with a gas exhaust pipe 112 coupled thereto while a valve 111 is opened. This pipe 112 composes a third flow path of the embodiment apparatus of FIG. 1.

A principal feature unique to this embodiment is as follows. Upon transition from the vapor phase growth process to the cleaning process, the valves 107A and 107B are closed to thereby tightly vacuum—namely, create a high vacuum—specific part of the gas flow system including both the valve 107A on the $SiH_4$ gas supply source side (spanning from chamber 103 to valve 107A via valve 107a) and the valve 107B (covering from chamber 103 to valve 107B via valve 107b) in addition to the interior space of chamber 103. Under such high-vacuum condition, let the $SiH_4$ gas be drained away from within the inside spaces of the pipes involved. It is after the evacuation of $SiH_4$ gas that the valves 107a-107b are closed together. Thereafter, the $ClF_3$ gas is introduced into chamber 103, followed by execution of cleaning.

Very importantly, the introduction of such $ClF_3$ cleaning gas is interrupted by forcing valve 109 to close, whenever any one of the pressure switches 114A and 114B—one of which is midway between the valves 107a and 107A, and the other of which is between valves 107b and 107B—detects an increase in gas pressure during supply of $ClF_3$ gas. More specifically, when pressure switch 114A, 114B senses aberrant pressure rise-up, a detection signal indicative of it is sent to the control device 115. In responding thereto, controller 115 drives the valve 109 to close immediately, thereby disabling feeding of the cleaner gas.

With the "pressure-sensitive gas flow control" feature, it is possible to preclude or minimize the risk of unwanted mixture of the $SiH_4$ gas and the cleaner gas even in cases where a small mount of residual $SiH_4$ gas is left or gas leakage takes place due to slacking of valves 107A-107B.

In other words, the cleaner gas feed is halted without appreciable time-lag by closing the valve 109 at any time the pressure switch 114 between the valve 107A, 107B and valve 107a, 107b detects abnormality. Thus, any irregular mixture of the SiH$_4$ and ClF$_3$ gases is no longer occurrable within the aperture. This contributes to achievement of enhanced safety.

Another advantage of the embodiment apparatus with the above-stated control scheme lies in an ability to monitor the risk of accidental mixture of reactant (SiH$_4$) and cleaner (ClF$_3$) gases on a real-time basis even in the process of introducing the cleaner gas into the chamber 103.

Accordingly the vapor phase epitaxy apparatus embodying the invention may offer increased safety owing to preclusion of the SiH$_4$/cleaner gas mixture risk.

While this embodiment is set forth under an assumption that one or more single-crystal Si layers are formed on a target wafer, similar results are also obtainable when applied to fabrication of poly-Si layers or compound semiconductor layers made of gallium arsenide (GaAs), gallium aluminum arsenide (GaAlAs) or indium gallium arsenide (InGaAs), for example. If this is the case, it is required to change the reactant gas for film formation use. Although the cleaning gas used is typically a fluorine-based gas, other kinds of gases are alternatively employable as far as these have chamber interior cleaning capabilities.

Additionally the principles of the invention are also applicable to the case of forming silicon dioxide (SiO$_2$) films and Si$_3$N$_4$ films. In such case, the reactant gas and the cleaning gas are replaced by appropriate ones other than those stated previously.

In the case of SiO$_2$ films, gases of nitrogen (N$_2$), oxygen (O$_2$) and argon (Ar) are supplied in addition to the monosilane (SiH$_4$) gas. In the case of Si$_3$N$_4$ films, gases of ammonia (NH$_3$), N$_2$ and O$_2$ are fed along with the SiH$_4$ gas. A cleaning gas used at this time may be a gas of CF$_3$, C$_2$F$_6$, COF$_2$ or equivalents thereto. In these cases also, it becomes possible to enhance the safety as in the embodiment above.

Embodiment 2

Turning to FIG. 2A, a vapor phase epitaxy apparatus also embodying the invention is shown. This apparatus is similar to that of FIG. 1 in basic arrangement except for its reactant/cleaning gas feed pipe system as will be discussed later. As shown in FIG. 2A, a single-crystal Si wafer 202 is loaded into a reactor chamber 203 and mounted on a support table structure 203. The wafer 202 is heated by a heater 204 up to a temperature need for film fabrication thereon.

Coupled to the chamber 203 is a first flow path, i.e., gas feed passage 205a for supplying a reactant gas of SiH$_4$. This passage 205a may be a pipe having its opposite end coupled to a gas cylinder 206a. Gas pipe 205a is coupled together or "commonized" at a midstream portion with a hydrogen (H$_2$) gas flow pipe 205b. This pipe 205b has its other terminate end which is coupled to a gas cylinder 206b. A serial combination of valves 207A and 207a and another pair of valves 207B and 207b are provided for opening and closing to thereby flow and block a carrier gas of H$_2$ as supplied from the cylinder 206b. At the common or "confluence" part of the gas pipes 205a-205b, a gas sensor 216 is connected. This gas sensor has its output connected to a control device 215. Also connected thereto is a valve 209 for controlling the flow of a cleaning gas of ClF$_3$ from a cylinder 210.

By letting the SiH$_4$ gas contain therein boron (in the form of a dopant gas of diborane (B$_2$H$_6$)), it is possible to form a p-type single-crystal Si layer. Alternatively, adding phosphorus (using a phosphine (PH$_3$) gas) to the SiH$_4$ gas enables formation of an n-type single-crystal Si layer. The dopant gas to be contained in SiH$_4$ gas should not exclusively be limited to the B$_2$H$_6$ and PH$_3$ gases and may be replaced with other gases which contain Al and As or other similar suitable dopants.

When the valves 107A-a and 107B-b are driven to open, the SiH$_4$ and H$_2$ gases from the cylinders 206a-206b are guided to flow through pipes 205a-205b, resulting in SiH$_4$ gas being supplied to the interior space of chamber 203 with the aid of H$_2$ gas, so a single-crystal Si film is formed on the wafer 202 on table 201. This film formation will usually be done consecutively. Note here that in this case, the H$_2$ gas is not fed to chamber 203 and released or "dumped" to outside of the apparatus.

The chamber 203 is also associated with a ClF$_3$ gas flow pipe 208, which is coupled thereto as a second flow path of the vapor phase growth apparatus. This pipe 208 has a valve 209 at a midstream position thereof. This valve 209 is connected to and open/close-controlled by the control device 215. The ClF$_3$ gas feed pipe 208 is coupled at its other end to a gas cylinder 210 associated therewith.

After completion of the intended on-wafer film formation, the interior of chamber 203 is applied cleaning. In this event, the valve 209 is driven to open, permitting the ClF$_3$ gas from cylinder 210 to flow through pipe 208, resulting in introduction into chamber 203.

During the on-wafer film formation and chamber-inside cleaning processes, residual gases within chamber 203 are discharged or "vacuumed" by a vacuum pump 213 that is coupled to a gas exhaust pipe 212 while a valve 211 therein is opened. This pipe 212 constitutes a third flow path in the embodiment apparatus of FIG. 2A.

In this embodiment, upon changing from the vapor phase growth process to the cleaning process, first close the valve 207A to thereby vacuum not only the inside space of the chamber 203 but also the inner space of certain part of the gas supply pipe system covering up to the valve 207A on the SiH$_4$ gas supply source side (i.e., covering from chamber 203 to the valve 207A via valve 207a), thereby forcing residual SiH$_4$ gas components to be drained away from inside of the pipe. After having exhausted the SiH$_4$ gas almost completely, let valve 207a close. Thereafter, drive valve 109 to open, allowing the ClF$_3$ cleaner gas to be fed into chamber 203 for execution of cleaning.

An important feature of this embodiment is that whenever the gas detector 216 placed at the common pipe portion between the valves 207a and 207A detects the presence of SiH$_4$ gas while the cleaning gas of ClF$_3$ is being introduced into chamber 203, immediately close valve 209 to interrupt the cleaner gas introduction. More precisely, upon detection of the presence of SiH$_4$ gas at gas sensor 216, a detection signal as output therefrom is passed to the control device 215. In responding thereto, control device 215 forces valve 209 to close, resulting in the cleaner gas feed being disabled. Providing control in this way makes it possible to detect residual SiH$_4$ gas components within the first flow path even where a less amount of SiH$_4$ gas continues to reside or gas leakage occurs due to possible slackness of valve 207A. This in turn ensures that accidental mixture of the SiH$_4$ gas and the cleaner gas hardly takes place within chamber 203.

With the control technique in this apparatus, it becomes possible to monitor or "watchdog" the risk of SiH$_4$-and-cleaner gas mixture on a real time basis even in mid course of introducing the cleaner gas into chamber 203.

Consequently, the vapor phase epitaxy apparatus of this embodiment may offer increased safety owing to its avoidability of the risk of the reactant/cleaner gas mixture within the chamber.

In the case of the embodiment shown in FIG. 2A, the film fabrication is usually carried out in reduced or low pressure environments. So, it is desirable that a nitrogen ($N_2$) gas be additionally supplied to the chamber interior as a purging gas as shown in FIG. 2B. A vapor phase epitaxy apparatus shown herein is configured to meet this need. The apparatus is similar in structure to that of FIG. 2A with a purge gas feed pipe 205c and its associated $N_2$ gas cylinder 206c being added thereto. As shown in FIG. 2B, the purge gas pipe 205c is part of the first flow path and has a couple of valves 207C and 207c at its portions in the upstream and downstream of the gas sensor 216, respectively. Preferably these valves are controlled by a control device 215 so that they open while the $SiH_4$ gas is presently fed to chamber 203.

As apparent from the foregoing description, the vapor phase growth apparatus in accordance with Embodiment 1 is arranged to include a first flow path for supplying a gas needed to form by vapor phase epitaxy (VPE) techniques more than one film on a wafer as received in a chamber, a valve unit for controlling the gas flowing in the first flow path, a second flow path for supplying a cleaning gas into the chamber to thereby permit cleaning of the chamber interior, and a third flow path for exhaust of residual gases within the chamber, characterized in that the valve unit has a serial combination of two-stage valves with a pressure switch being provided therebetween.

The vapor phase growth apparatus in Embodiment 2 is arranged to include a first flow path for supplying a gas needed to form by vapor phase epitaxy more than one film on a wafer as received in a chamber, a valve unit for controlling gas flow in the first flow path, a second flow path for supplying a cleaning gas into the chamber to thereby permit cleaning of the chamber interior, and a third flow path for exhausting residual gases in this chamber, featured in that the valve unit has a serial combination of two-stage valves with a gas sensor being provided therebetween.

In the above-stated embodiments the first flow path features in that it is made up of a parallel combination of a passage for supplying a hydride gas and a passage for feeding a carrier gas. A respective one of these passages has two stages of valves with a pressure switch being provided midway between them.

Alternatively the first flow path is comprised of a hydride gas supply passage and a carrier gas feed passage, which are arranged independently of each other and which are commonized via a first valve with a gas sensor provided at an intermediate portion of such common part.

The first flow path may be arranged to have a parallel configuration of passages, one of which is supplied with a gas of $SiH_4$ and the other of which is with a hydrogen ($H_2$) gas while letting a $ClF_3$ gas be fed to the second flow path.

Preferably, in case the gas sensor is provided, the first flow path is equipped with an auxiliary passage for supplying a nitrogen ($N_2$) gas.

A feature of the above-stated embodiment method is as follows. When using the vapor phase growth apparatus of Embodiment 1 to supply the cleaning gas into the chamber, close the two-stage valves and then initiate the cleaning. During cleaning, the pressure switch operates to monitor a gas pressure on a real-time basis. Upon detection of a change or variation in gas pressure, control is provided to interrupt supplying of the cleaner gas, thereby to preclude the risk of unwanted mixture of the hydride gas and cleaning gas.

Another approach to using the vapor phase growth apparatus of Embodiment 2 to supply the cleaning gas into the chamber has also been set forth above, which features in that during cleaning with the two-stage valves being closed, the gas sensor monitors a present state of gas flow. Whenever this sensor detects the presence of hydride gas components, control is provided to immediately halt supplying of the cleaner gas to thereby avoid unwanted mixture of the hydride and cleaner gases.

Although the embodiments above are each arranged to use as the hydride gas a gas of silane ($SiH_4$), which is replaceable by other similar suitable gaseous materials including, but not limited to, trichlorsilane ($SiHCl_3$) and dichlorosilane ($SiH_2Cl_2$). Additionally, in order to form a p- or n-type film, the $SiHCl_3$ or $SiH_2Cl_2$ gas may be designed to contain therein a less amount of $B_2H_6$ gas or $PH_3$ gas.

According to the embodiments stated supra, the cleaning gas ($ClF_3$ gas) feed is quickly interrupted even in mid course of the cleaning, whenever a change occurs in pressure of the pressure switch as provided between the gas-feed valve side or, alternatively, when the gas sensor that is settled between the gas feed-side valves detects the presence of a gas(es). The interruption of cleaner gas delivery precludes or "depletes" the coexistence of the reactant gas—e.g., gaseous $SiH_4$, $SiHCl_3$ or $SiH_2Cl_2$—and the cleaning gas in the chamber. Thus it becomes possible to provide the improved vapor phase growth apparatus and vapor phase growth method using this apparatus while achieving enhanced safety and high-quality film fabrication capability with increased reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and equivalents thereto.

What is claimed is:

1. A vapor phase growth apparatus comprising:
    a first flow path used to supply a chamber with a hydride gas as required for vapor phase epitaxial film formation on or above a wafer being received in the chamber, said first flow path including a series combination of two-stage valves;
    a second flow path configured to supply into said chamber a $ClF_3$ gas for cleaning of inside of said chamber;
    a third flow path configured to exhaust a residual gas within said chamber;
    a pressure switch being provided between said series combination of two-stage valves;
    a valve configured to control flow of the $ClF_3$ gas in said second flow path; and
    a control device configured to control flow of the hydride gas in the first flow path, one of said series combination of two-stage valves of said first flow path being controlled to close, and then another one of said series combination of two-stage valves of said first flow path being controlled to close after said hydride gas had been drained away from within an inside space of said first flow path including a space of the first flow path between said series combination of two-stage valves, to control said valve of said second flow path to open after said series combination of two-stage valves had been closed after said hydride gas had been drained away from within the inside space of said first flow path, and then to control said valve of said second flow path to close for preventing supplying of the $ClF_3$ gas when said pressure switch detects a change of an increase by the hydride gas which flows through one of said series combination of two-stage valves, in pressure of the space of the first flow path between said series combination of two-stage valves during supplying the $ClF_3$ gas into said chamber by the second flow path.

2. The apparatus of claim 1 wherein said first flow path includes a parallel combination of a passage for supply of said hydride gas and a carrier gas flow passage, each of the passages having two stages of valves with a pressure switch being placed between said passages.

3. The apparatus of claim 2 wherein said hydride gas is one selected from the group consisting of a silane ($SiH_4$) gas, a trichlorsilane ($SiHCl_3$) and a dichlorosilane ($SiH_2Cl_2$) gas.

4. The apparatus of claim 1 wherein said first flow path has a parallel combination of passages one of which is supplied with any one of a silane ($SiH_4$) gas, a trichlorsilane ($SiHCl_3$) gas and a dichlorosilane ($SiH_2Cl_2$) gas and a remaining one of which is fed with a hydrogen ($H_2$) gas while letting said $ClF_3$ gas be fed to said second flow path.

5. The apparatus of claim 4 wherein said one of the passages is arranged to contain therein any small amount of gas as selected from the group consisting of diborane ($B_2H_6$) and phosphine ($PH_3$) gases.

* * * * *